US009460666B2

(12) United States Patent
Sprague et al.

(10) Patent No.: US 9,460,666 B2
(45) Date of Patent: Oct. 4, 2016

(54) DRIVING METHODS AND WAVEFORMS FOR ELECTROPHORETIC DISPLAYS

(75) Inventors: Robert Sprague, Saratoga, CA (US); Bryan Chan, San Francisco, CA (US); Tin Pham, San Jose, CA (US); Craig Lin, San Jose, CA (US); Manasa Peri, Milpitas, CA (US)

(73) Assignee: E INK CALIFORNIA, LLC, Fremont, CA (US)

( * ) Notice: Subject to any disclaimer, the term of this patent is extended or adjusted under 35 U.S.C. 154(b) by 149 days.

(21) Appl. No.: 12/772,330

(22) Filed: May 3, 2010

(65) Prior Publication Data

US 2010/0283804 A1 Nov. 11, 2010

Related U.S. Application Data

(60) Provisional application No. 61/177,204, filed on May 11, 2009.

(51) Int. Cl.

| | |
|---|---|
| ***G09F 9/302*** | (2006.01) |
| ***G09G 3/20*** | (2006.01) |
| ***G02F 1/1347*** | (2006.01) |
| ***E04D 13/08*** | (2006.01) |
| ***G01R 13/02*** | (2006.01) |

(Continued)

(52) U.S. Cl.

CPC ........ *G09G 3/344* (2013.01); *G09G 2310/061* (2013.01); *G09G 2310/068* (2013.01); *G09G 2320/0252* (2013.01)

(58) Field of Classification Search

CPC ................. G09G 2310/04; G09G 2300/0814; G09G 2300/0473; G09G 2300/0443; G09G 2320/029; G09G 2300/08; G09G 2310/061; G09G 3/2018; G09F 9/302

USPC ............ 345/107, 173, 690, 89, 83; 156/278; 359/296; 40/450

See application file for complete search history.

(56) References Cited

U.S. PATENT DOCUMENTS 3,612,758 A 10/1971 Evans et al.
4,143,947 A 3/1979 Aftergut et al.

(Continued)

FOREIGN PATENT DOCUMENTS

JP 03282691 12/1991
JP 2000-336641 1/2002

(Continued)

OTHER PUBLICATIONS

U.S. Appl. No. 13/289,403, filed Nov. 4, 2011, Lin et al.

(Continued)

*Primary Examiner* — Lin Li
(74) *Attorney, Agent, or Firm* — Perkins Coie LLP

(57) ABSTRACT

This application is directed to driving methods for electrophoretic displays. The driving methods and waveforms have the advantage that they provide a clean and smooth transition from one image to another image, without flashing or other undesired visual interruptions. The methods also provide faster image transitions. In an embodiment, a method drives a display device from a first image to a second image wherein images of a first color are displayed with a background of a second color, which method comprises driving pixels of the first color directly to the second color before driving pixels of the second color directly to the first color.

7 Claims, 6 Drawing Sheets

(51) Int. Cl.
*H04B 7/06* (2006.01)
*G09G 3/34* (2006.01)

(56) References Cited

U.S. PATENT DOCUMENTS 4,259,694 A 3/1981 Liao
4,443,108 A 4/1984 Webster
4,568,975 A 2/1986 Harshbarger et al.
4,575,124 A 3/1986 Morrison et al.
4,972,099 A 11/1990 Amano et al.
5,266,937 A 11/1993 DiSanto et al.
5,272,477 A 12/1993 Tashima et al.
5,298,993 A 3/1994 Edgar et al.
5,754,584 A 5/1998 Durrant et al.
5,831,697 A 11/1998 Evanicky et al.
5,923,315 A 7/1999 Ueda et al.
5,926,617 A 7/1999 Ohara et al.
5,930,026 A 7/1999 Jacobson et al.
5,961,804 A 10/1999 Jacobson et al.
6,005,890 A 12/1999 Clow et al.
6,019,284 A 2/2000 Freeman et al.
6,045,756 A 4/2000 Carr et al.
6,069,971 A 5/2000 Kanno et al.
6,075,506 A * 6/2000 Bonnett et al. ................. 345/89
6,111,248 A 8/2000 Melendez et al.
6,154,309 A 11/2000 Otani et al.
6,219,014 B1 * 4/2001 Havel .................... G01R 13/02 340/815.82
6,504,524 B1 1/2003 Gates et al.
6,526,700 B1 * 3/2003 Pilcher .................... E04D 13/08 137/357
6,531,997 B1 3/2003 Gates et al.
6,532,008 B1 3/2003 Guralnick
6,639,580 B1 10/2003 Kishi et al.
6,657,612 B2 12/2003 Machida et al.
6,671,081 B2 12/2003 Kawai
6,674,561 B2 1/2004 Ohnishi et al.
6,686,953 B1 2/2004 Holmes
6,774,883 B1 8/2004 Muhlemann
6,796,698 B2 9/2004 Sommers et al.
6,885,495 B2 4/2005 Liang et al.
6,902,115 B2 6/2005 Graf et al.
6,903,716 B2 6/2005 Kawabe et al.
6,914,713 B2 7/2005 Chung et al.
6,927,755 B2 8/2005 Chang
6,930,818 B1 8/2005 Liang et al.
6,932,269 B2 8/2005 Sueyoshi et al.
6,950,220 B2 9/2005 Abramson et al.
6,970,155 B2 * 11/2005 Cabrera ........................ 345/107
6,987,503 B2 1/2006 Inoue
6,995,550 B2 2/2006 Jacobson et al.
7,046,228 B2 5/2006 Liang et al.
7,177,066 B2 2/2007 Chung et al.
7,202,847 B2 4/2007 Gates
7,242,514 B2 7/2007 Chung et al.
7,277,074 B2 10/2007 Shih
7,283,119 B2 10/2007 Kishi
7,307,779 B1 12/2007 Cernasov et al.
7,349,146 B1 3/2008 Douglass et al.
7,504,050 B2 3/2009 Weng et al.
7,515,877 B2 * 4/2009 Chen .................... H04B 7/0613 370/332
7,528,822 B2 5/2009 Amundson et al.
7,626,444 B2 12/2009 Clewett et al.
7,701,436 B2 4/2010 Miyasaka
7,733,311 B2 6/2010 Amundson et al.
7,773,069 B2 8/2010 Miyasaka et al.
7,800,580 B2 9/2010 Johnson et al.
7,804,483 B2 9/2010 Zhou et al.
7,816,440 B2 10/2010 Matsui
7,839,381 B2 11/2010 Zhou et al.
7,952,558 B2 5/2011 Yang et al.
7,999,787 B2 8/2011 Amundson et al.
8,035,611 B2 10/2011 Sakamoto
8,044,927 B2 10/2011 Inoue
8,054,253 B2 11/2011 Yoo
8,102,363 B2 1/2012 Hirayama
8,125,501 B2 2/2012 Amundson et al.
2002/0021483 A1 2/2002 Katase
2002/0033792 A1 * 3/2002 Inoue ............................ 345/107
2003/0011868 A1 1/2003 Zehner et al.
2003/0035885 A1 2/2003 Zang et al.
2003/0067666 A1 4/2003 Kawai
2003/0095090 A1 5/2003 Ham
2003/0137521 A1 7/2003 Zehner et al.
2003/0193565 A1 10/2003 Wen et al.
2003/0227451 A1 12/2003 Chang
2004/0074120 A1 * 4/2004 Fryer ...................... G09F 9/302 40/450
2004/0112966 A1 6/2004 Pangaud
2004/0120024 A1 6/2004 Chen et al.
2004/0216836 A1 * 11/2004 Ukigaya ....................... 156/278
2004/0219306 A1 11/2004 Wang et al.
2004/0227746 A1 11/2004 Shih
2004/0246562 A1 12/2004 Chung et al.
2004/0263450 A1 12/2004 Lee et al.
2005/0001812 A1 1/2005 Amundson et al.
2005/0162377 A1 7/2005 Zhou et al.
2005/0163940 A1 7/2005 Liang et al.
2005/0179642 A1 8/2005 Wilcox et al.
2005/0185003 A1 8/2005 Dedene et al.
2005/0219184 A1 10/2005 Zehner et al.
2006/0049263 A1 3/2006 Ou et al.
2006/0050361 A1 3/2006 Johnson
2006/0132426 A1 6/2006 Johnson
2006/0139305 A1 * 6/2006 Zhou et al. ................... 345/107
2006/0139309 A1 6/2006 Miyasaka
2006/0164405 A1 7/2006 Zhou
2006/0176410 A1 * 8/2006 Nose ................... G02F 1/13473 349/1
2006/0187186 A1 8/2006 Zhou et al.
2006/0192751 A1 8/2006 Miyasaka et al.
2006/0209055 A1 9/2006 Wakita
2006/0232547 A1 10/2006 Johnson et al.
2006/0238488 A1 10/2006 Nihei et al.
2006/0262147 A1 11/2006 Kimpe et al.
2007/0035510 A1 2/2007 Zhou et al.
2007/0046621 A1 3/2007 Suwabe et al.
2007/0046625 A1 3/2007 Yee
2007/0052668 A1 * 3/2007 Zhou et al. ................... 345/107
2007/0070032 A1 3/2007 Chung et al.
2007/0080926 A1 4/2007 Zhou et al.
2007/0080928 A1 4/2007 Ishii et al.
2007/0091117 A1 4/2007 Zhou et al.
2007/0103427 A1 5/2007 Zhou et al.
2007/0109274 A1 5/2007 Reynolds
2007/0132687 A1 6/2007 Johnson
2007/0146306 A1 6/2007 Johnson et al.
2007/0159682 A1 7/2007 Tanaka et al.
2007/0182402 A1 8/2007 Kojima
2007/0188439 A1 8/2007 Kimura et al.
2007/0200874 A1 8/2007 Amundson et al.
2007/0247417 A1 10/2007 Miyazaki et al.
2007/0262949 A1 11/2007 Zhou et al.
2007/0276615 A1 11/2007 Cao et al.
2007/0296690 A1 12/2007 Nagasaki
2008/0150886 A1 6/2008 Johnson et al.
2008/0158142 A1 7/2008 Zhou et al.
2008/0211833 A1 * 9/2008 Inoue ................... G09G 3/2018 345/690
2008/0273022 A1 11/2008 Komatsu
2008/0303780 A1 12/2008 Sprague et al.
2009/0096745 A1 4/2009 Sprague et al.
2009/0237351 A1 * 9/2009 Kanamori et al. ............ 345/107
2009/0267970 A1 10/2009 Wong et al.
2010/0134538 A1 6/2010 Sprague et al.
2010/0194733 A1 8/2010 Lin et al.
2010/0194789 A1 8/2010 Lin et al.
2010/0238203 A1 9/2010 Stroemer et al.
2010/0283804 A1 11/2010 Sprague et al.
2010/0295880 A1 11/2010 Sprague et al.
2011/0096104 A1 4/2011 Sprague et al.
2011/0175945 A1 7/2011 Lin

(56) References Cited

U.S. PATENT DOCUMENTS

| | | | |
|---|---|---|---|
| 2011/0216104 A1 | 9/2011 | Chan et al. |
| 2012/0274671 A1 | 11/2012 | Sprague et al. |
| 2012/0320017 A1 | 12/2012 | Sprague et al. |

FOREIGN PATENT DOCUMENTS

| | | | |
|---|---|---|---|
| JP | 2002-14654 A | 1/2002 |
| KR | 10-2008-0055331 | 6/2008 |
| KR | 1020090129191 A | 12/2009 |
| TW | 200625223 | 7/2006 |
| WO | WO 01/67170 A1 | 9/2001 |
| WO | WO 2005004099 A1 | 1/2005 |
| WO | WO 2005031688 A1 | 4/2005 |
| WO | WO2005034076 A1 | 4/2005 |
| WO | WO 2009/049204 | 4/2009 |
| WO | WO 2010/132272 | 11/2010 |

OTHER PUBLICATIONS

Allen, K., "Electrophoretics Fulfilled", Emerging Displays Review: Emerging Display Technologies, Monthly Report—Oct. 2003, 24 pages.
Bardsley, J.N. et al., "Microcup™ Electrophoretic Displays", USDC Flexible Display Report, 3.1.2., dated Nov. 2004, 5 pages.
Chaug, Y.S. et al.,"Roll-to-Roll Processes for the Manufacturing of Patterned Conductive Electrodes on Flexible Substrates", Mat. Res. Soc. Symp. Proc., vol. 814, I9.6.1, dated Apr. 2004, 6 pages.
Chen, S.M., "The Applications for the Revolutionary Electronic Paper Technology", OPTO News & Letters, (in Chinese, English abstract), 12 pages, Dated Jul. 2003.
Chen, S.M., "The New Application and the Dynamics of Companies". TRI, 14 pages, dated May 2003, (In Chinese, English abstract).
Chung, J. et al. "Microcup® Electrophoretic Displays Grayscale and Color Rendition", IDW, AMD2/EP, 4 pages, dated Dec. 2003.
Ho, A., "Embedding e-Paper in Smart Cards, Pricing Labels & Indicators". Presentation conducted at Smart Paper Conference Nov. 15-16, 2006, Atlanta, GA, dated Nov. 2006, 11 pages.
Ho, C. et al. "Microcup® Electronic Paper by Roll-to-Roll Manufacturing Processes". Presentation conducted at FEG, Nei-Li, Taiwan, 36 pages, dated Dec. 2003.
Ho, C. et al., "Microcupt® Electronic Paper Device and Application", Presentation conducted at USDC 4th Annual Flexible Display Conference 2005, 14 pages, Feb. 2005.
Hopper et al., "An Electrophoretic Display, Its Properties, Model and Addressing", IEEE Trans. Electr. Dev., ED 26, No. 8, 8 pages, dated 1979.
Hou J. et al. "Reliability and Performance of Flexible Electrophoretic Displays by Roll-to-Roll Manufacturing Processes", SID Digest, 32.3, 4 pages, May 2004.
Howard, R. "Better Displays with Organic Films", Scientific American, 8 pages, dated Feb. 2004.
Kishi, et al., "Development of In-plane EPD", SID 2000 Digest, 4 pages, dated 2000.
Lee H. et al., "SiPix Microcup® Electronic Paper—An Introduction". Advanced Display, Issue 37, (in Chinese, English abstract), 10 pages, dated Jun. 2003.
Liang, R.C. "Microcup® Electrophoretic and Liquid Crystal Displays by Roll-to-Roll Manufacturing Processes", Presentation conducted at the Flexible Microelectronics & Displays Conference of U.S. Display Consortium, Phoenix, Arizona, USA, dated Feb. 2003, 4 pages.
Liang, R.C., "Microcup Electronic Paper by Roll-to-Roll Manufacturing Process", Presentation at the Flexible Displays & Electronics 2004 of Intertech, San Francisco, California, USA, 26 pages, Apr. 2004.
Liang, R.C. "Flexible and Roll-able Displays/Electronic Paper—A Technology Overview", Paper presented at the METS 2004 Conference in Taipei, Taiwan, 27 pages, dated Oct. 2004.
Liang, R. et al. "Microcup® Active and Passive Matrix Electrophoretic Displays by a Roll-to-Roll Manufacturing Processes", SID Digest, 20.1, dated 2003, 4 pages.
Liang, R., et al. "Microcup Electrophoretic Displays by Roll-to-Roll Manufacturing Processes".,IDW , EP2-2, 4 pages, dated Dec. 2002.
Liang, R., et al., "Passive Matrix Microcup® Electrophoretic Displays", Paper presented at the IDMC, Taipei, Taiwan, 4 pages, dated Feb. 2003.
Liang, R. et al., "Microcup® displays : Electronic Paper by Roll-to-Roll Manufacturing Processes", Journal of the SID, 11(4), 10 pages, dated 2003.
Liang, R. et al,. "Format Flexible Microcup® Electronic Paper by Roll-to-Roll Manufacturing Process", Presentation conducted at the 14th FPD Manufacturing Technology EXPO & Conference, 44 pages, dated Jun./Jul. 2004.
Liang, R. et al. "Microcup® LCD, A New Type of Dispersed LCD by a Roll-to-Roll Manufacturing Process", Paper presented at the IDMC, Taipei, Taiwan, 4 pages, dated Feb. 2003.
Swanson, et al., "High Performance EPDs", SID 2000, pp. 29-31, dated 2000.
Liang, R. et al., "Newly-Developed Color Electronic Paper Promises—Unbeatable Production Efficiency.", Nikkei Microdevices, p. 3. (in Japanese, with English translation) 4 pages, dated Dec. 2002.
Wang X., et al. "Mirocup® Electronic Paper and the Converting Processes", ASID, 10.1.2-26, 4 pages, dated Feb. 2004, Nanjing, China.
Wang et al. "Microcup® Electronic Paper and the Converting Processes", Advanced Display, Issue 43, 6 pages, dated Jun. 2004, (in Chinese, English abstract).
Wang X. et al. "Inkjet Fabrication of Multi-Color Microcup® Electrophorectic Display" The Flexible Microelectronics & Displays Conference of U.S. Display Consortium, 11 pages, dated Feb. 2006.
Wang et al, "Roll-to-Roll Manufacturing Process for Full Color Electrophoretic film"., SID 2006 Digest, 3 pages, dated Jun. 2006.
Zang H., "Microcup Electronic Paper", Presentation conducted at the Displays & Microelectronics Conference of U.S. Display Consortium, Phoenix, Arizona, USA, 14 pages, dated Feb. 2004.
Zang H. "Microcup® Electronic Paper by Roll-to-Roll Manufacturing Processes". Presentation conducted at the Advisory Board Meeting, Bowling Green State University, Ohio, USA, 18 pages, dated Oct. 2003.
Zang H., "Microcup Electronic Paper by Roll-to-Roll Manufacturing Processes.", The Spectrum, 16(2), 6 pages, dated 2003.
Zang H. et al., "Flexible Microcup® EPD by RTR Process", Presentation conducted at 2nd Annual Paper-Like Displays Conference, Feb. 9-11, 2005, St. Pete Beach, Florida, 26 pages, dated Feb. 2005.
Zang H. et al., "Threshold and Grayscale Stability of Microcup® Electronic Paper", Proceeding of SPIE-IS&T Electronic Imaging, SPIE vol. 5289, 8 pages, dated Jan. 2004.
Zang H. et al., "Monochrome and Area Color Microcup® EPDs by Roll-to-Roll Manufacturing Processes." ICIS '06 International Congress of Imaging Science Final Program and Proceedings, 4 pages, dated May 2006.
Liang, R., "Flexible and Roll-able Displays/Electronic Paper—A Brief Technology Overview", Flexible Display Forum, dated Feb. 2005, Taiwan, 27 pages.
U.S. Appl. No. 12/046,197, filed Mar. 11, 2008, Wang et al.
U.S. Appl. No. 12/155,513, filed May 5, 2008, Sprague et al.
U.S. Appl. No. 13/004,763, filed Jan. 11, 2011, Lin et al.
U.S. Appl. No. 13/152,140, filed Jun. 2, 2011, Lin.
Sprague, R.A. "Active Matrix Displays for e-Readers Using Microcup Electrophoretics". Presentation conducted at SID 2011, 49 International Symposium Seminar and Exhibition, dated May 18, 2011, 20 pages.
Kao, WC., Ye, JA., Chu, MI., and Su, CY. (Feb. 2009) Image Quality Improvement for Electrophoretic Displays by Combining Contrast Enhancement and Halftoning Techniques. *IEEE Transactions on Consumer Electronics*, 2009, vol. 55, Issue 1, pp. 15-19.
Kao, WC., (Feb. 2009) Configurable Timing Controller Design for Active Matrix Electrophoretic Dispaly. *IEEE Transactions on Consumer Electronics*, 2009, vol. 55, Issue 1, pp. 1-5.

(56) References Cited

OTHER PUBLICATIONS

Kao, WC., Ye, JA., and Lin, C. (Jan. 2009) Image Quality Improvement for Electrophoretic Displays by Combining Contrast Enhancement and Halftoning Techniques. *ICCE 2009 Digest of Technical Papers*, 11.2-2.
Kao, WC., Ye, JA., Lin, FS., Lin, C., and Sprague, R. (Jan. 2009) Configurable Timing Controller Design for Active Matrix Electrophoretic Display with 16 Gray Levels. *ICCE 2009 Digest of Technical Papers*, 10.2-2.
Kao, WC., Fang, CY., Chen, YY., Shen, MH., and Wong, J. (Jan. 2008) Integrating Flexible Electrophoretic Display and One-Time Password Generator in Smart Cards. *ICCE 2008 Digest of Technical Papers*, p. 4-3. (Int'l Conference on Consumer Electronics, Jan. 9-13, 2008).
Korean Patent Office, "International Search Report & Written Opinion", dated Dec. 7, 2010, application No. PCT/US2010/033906, 9 pages.
Current Claims for Korean application No. PCT/US2010/033906, 1 page.
U.S. Appl. No. 11/607,757, filed Nov. 30, 2006, Final Office Action, Apr. 6, 2012.
U.S. Appl. No. 12/132,238, filed Jun. 3, 2008, Final Office Action, May 1, 2012.

* cited by examiner

DRIVING METHODS AND WAVEFORMS FOR ELECTROPHORETIC DISPLAYS

CROSS REFERENCE TO RELATED APPLICATIONS

This application claims the benefit of priority under 35 U.S.C. §119(e) from U.S. Provisional Application Ser. No. 61,177,204 entitled "DRIVING METHODS AND WAVEFORMS FOR ELECTROPHORETIC DISPLAY", filed May 11, 2009, the entire contents of which are incorporated by this reference for all purposes as if fully set forth herein.

TECHNICAL FIELD

The present disclosure relates to driving methods and waveforms for a display device, in particular, an electrophoretic display.

BACKGROUND OF THE INVENTION

An electrophoretic display (EPD) is a non-emissive device based on the electrophoresis phenomenon of charged pigment particles suspended in a solvent. The display usually comprises two plates with electrodes placed opposing each other. One of the electrodes is usually transparent. A suspension composed of a colored solvent and charged pigment particles is enclosed between the two plates. When a voltage difference is imposed between the two electrodes, the pigment particles migrate to one side or the other, according to the polarity of the voltage difference. As a result, either the color of the pigment particles or the color of the solvent may be seen at the viewing side. In general, an EPD may be driven by a uni-polar or bi-polar approach.

SUMMARY OF THE DISCLOSURE

The present disclosure is directed to driving methods and waveforms for a display device, in particular, an electrophoretic display.

A first aspect is directed to a method for driving a display device from a first image to a second image wherein images of a first color are displayed with a background of a second color, which method comprises driving pixels of the first color directly to the second color before driving pixels of the second color directly to the first color. In one embodiment, the first color is dark or black and the second color is light or white, or vice versa. In one embodiment, the method further comprises double pushing which pushes charged pigment particles in the display cells without causing color change.

A second aspect is directed to a method for driving a display device from a first image to a second image wherein images of a first color are displayed with a background of a second color, which method comprises driving pixels of the first color state directly to a first intermediate color state before driving the pixels of the second color state directly to a second intermediate color state. In one embodiment, the first color is dark or black and the second color is light or white and the first and second intermediate colors are grey. In one embodiment, the first and second intermediate colors have different intensity levels. In another embodiment, the first and second intermediate colors have the same intensity level.

The driving methods and waveforms can provide a clean and smooth transition from one image to another image, without flashing or other undesired visual interruptions.

DETAILED DESCRIPTION

Figure 1:
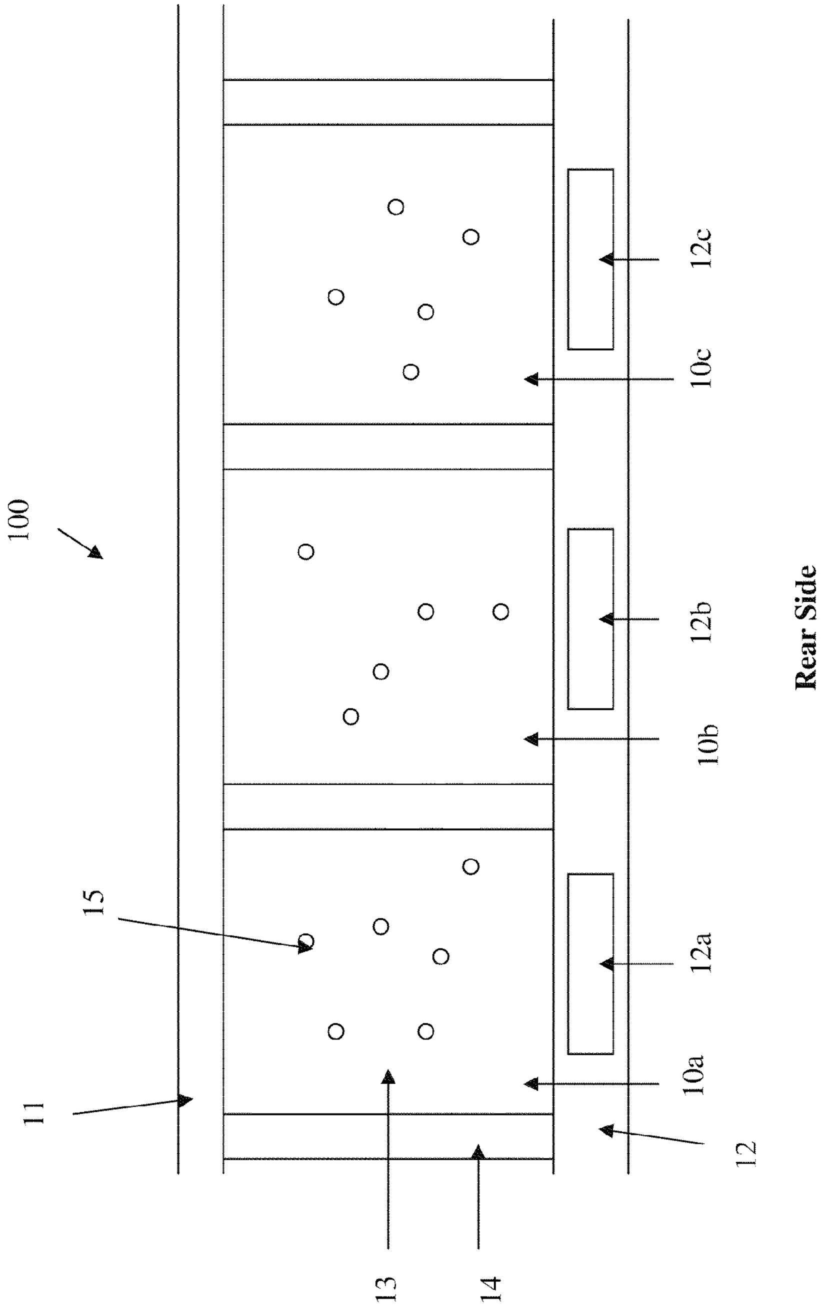
FIG. 1 is a cross-section view of a typical electrophoretic display device.

FIG. 1 illustrates a typical array of electrophoretic display cells 10*a*, 10*b* and 10*c* in a multi-pixel display 100 which may be driven by any of the driving methods presented herein. In FIG. 1, the electrophoretic display cells 10*a*, 10*b*, 10*c*, on a front viewing side, are provided with a common electrode 11 (which is usually transparent). On an opposing side (i.e., the rear side) of the electrophoretic display cells 10*a*, 10*b* and 10*c*, a substrate (12) includes discrete pixel electrodes 12*a*, 12*b* and 12*c*, respectively. Each of the pixel electrodes 12*a*, 12*b* and 12*c* defines an individual pixel of the multi-pixel electrophoretic display 100. However, in practice, a plurality of display cells may be associated with one discrete pixel electrode or a plurality of pixels may be associated with one display cell. The pixel electrodes 12*a*, 12*b*, 12*c* may be segmented in form rather than pixelated, defining regions of an image to be displayed rather than individual pixels. Therefore, while the term "pixel" or "pixels" is frequently used in this disclosure to illustrate driving implementations, the driving implementations are also applicable to segmented displays.

The display device may also be viewed from the rear side if the substrate 12 and the pixel electrodes are transparent.

An electrophoretic fluid 13 is filled in each of the electrophoretic display cells 10*a*, 10*b*, 10*c*. Each of the electrophoretic display cells 10*a*, 10*b*, 10*c* is surrounded by display cell walls 14.

The movement of the charged particles in a display cell is determined by a voltage potential difference applied to the common electrode and the pixel electrode associated with the display cell.

As an example, the charged particles 15 may be positively charged so that they will be drawn to a pixel electrode or the common electrode, whichever is at an opposite voltage potential from that of charged particles 15. If the same polarity is applied to the pixel electrode and the common electrode in a display cell, the positively charged pigment particles will then be drawn to the electrode which has a lower voltage potential.

In this application, the term "driving voltage" is used to refer to the voltage potential difference experienced by the charged particles in the area of a pixel. For example, if zero voltage is applied to a common electrode and a +15V is applied to a pixel electrode, then the "driving voltage" for the charged pigment particles in the area of the pixel would be +15V.

In another embodiment, the charged pigment particles 15 may be negatively charged.

The charged particles 15 may be white. Also, as would be apparent to a person having ordinary skill in the art, the charged particles may be dark in color and are dispersed in an electrophoretic fluid 13 that is light in color to provide sufficient contrast to be visually discernable.

The electrophoretic display could also be made with a clear or lightly colored electrophoretic fluid 13 and charged particles 15 having two different colors carrying opposite particle charges, and/or having differing electro-kinetic properties.

The electrophoretic display cells 10*a*, 10*b*, 10*c* may be of a conventional walled or partition type, a microencapsulted type or a microcup type, all of which are encompassed within the scope of the present disclosure. In the microcup type, the electrophoretic display cells 10*a*, 10*b*, 10*c* may be sealed with a top sealing layer. There may also be an adhesive layer between the electrophoretic display cells 10*a*, 10*b*, 10*c* and the common electrode 11.

As stated, a display device may be driven by a bi-polar approach or a uni-polar approach.

For bi-polar applications, it is possible to update areas from a first color to a second color and also areas from the second color to the first color, at the same time. The bi-polar approach requires no modulation of the common electrode and the driving from one image to another image may be accomplished, as stated, in only one driving phase.

For uni-polar applications, the pixels are driven to their destined color states in two driving phases. In phase one, selected pixels are driven from a first color to a second color. In phase two, the remaining pixels are driven from the second color to the first color.

The term "binary system" refers to a display device which can display images in two contrasting colors. For example, it may be black on white or white on black. In a more general description, the binary system has a first color on a second color. The first and second colors are any two colors which are visually discernable.

Figure 2A:
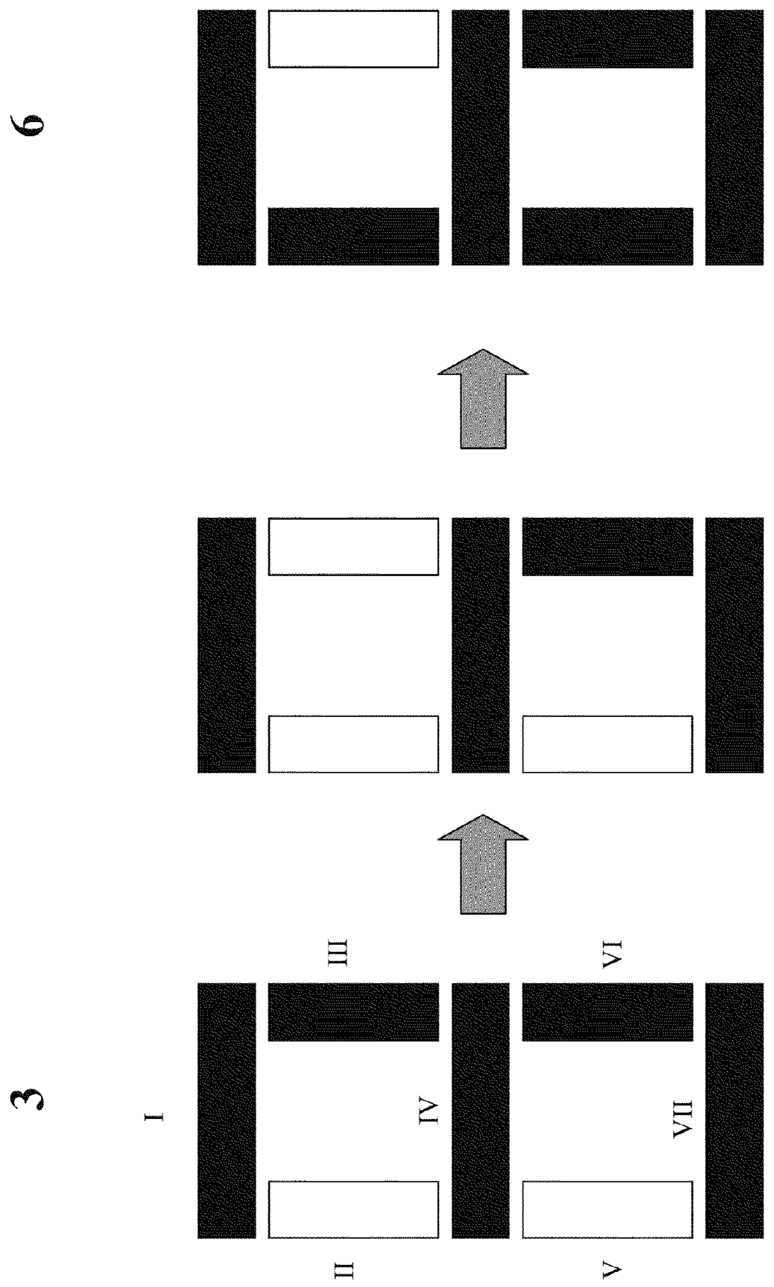
FIGS. 2*a* and 2*b* are examples of driving one image to another image utilizing the driving methods and waveforms of the present approaches.

FIG. 2*a* is one example which shows how the driving methods and waveforms of an example approach drive one image to another image in a binary system. A first image on the left side of FIG. 2*a* is driven to a transition image in the center and then to a second image on the right side of FIG. 2*a*. The images are displayed using an electronic digital segmented display and consist of seven segments labeled from I to VII respectively.

In the example of FIG. 2*a*, it is assumed that positively charged white pigment particles are dispersed in a black color solvent. The display device is capable of displaying black images with a white background.

The first initial image (representing the number "3") has five segments (I, III, IV, VI and VII) which are black and two segments (II and V) which are white. The second image (representing "6") has six black segments and only one white segment (III). The driving waveforms of the present disclosure are used to drive the first image to the second image. Between the two images, segments I, IV, VI and VII remain black while segment III changes from black to white and segments II and V change from white to black.

During transition from the first image to the second image, as shown in FIG. 2*a* by a transition image between the first image and the second image, segments I, IV, VI and VII remain unchanged. However, unlike past approaches, segment III changes from black to white before segments II and V change from white to black. A first transition step switches all black segments which will become white to white, and a second transition step switches all white segments which will become black to black.

FIG. 2*a* shows that by utilizing the driving methods and waveforms of the present approach, while driving black pixels to white and white pixels to black, the color change of black pixels to white takes place before the color change of white pixels to black. In other words, the color change of black to white and the color change of white to black do not occur simultaneously.

The uni-polar driving methods of the present disclosure are different from previous approaches. In previous approaches, the pixels of the first color and the pixels of the second color would be all driven to one color (the first color or the second color) and then individually driven to their destined color states. The methods therefore suffer from the disadvantage of a flashing appearance and longer driving time.

In the uni-polar driving methods of one present approach, the pixels of the first color are driven directly to the second color and the pixels of the second color are driven directly to the first color and the two driving steps occur sequentially.

A first aspect of this disclosure is directed to a method for driving a first image to a second image in a binary system wherein images of a first color are displayed with a background of a second color, which method comprises driving pixels of the first color directly to the second color before driving pixels of the second color directly to the first color.

In an example where black images are displayed with a white background, by applying the present method to drive a first image to a second image, the black pixels are driven directly to white before the white pixels are driven directly to black. Likewise, in an example where white images are displayed with a black background, by applying the present method to drive a first image to a second image, the white pixels are driven directly to black before the black pixels are driven directly to white.

Figure 2B:
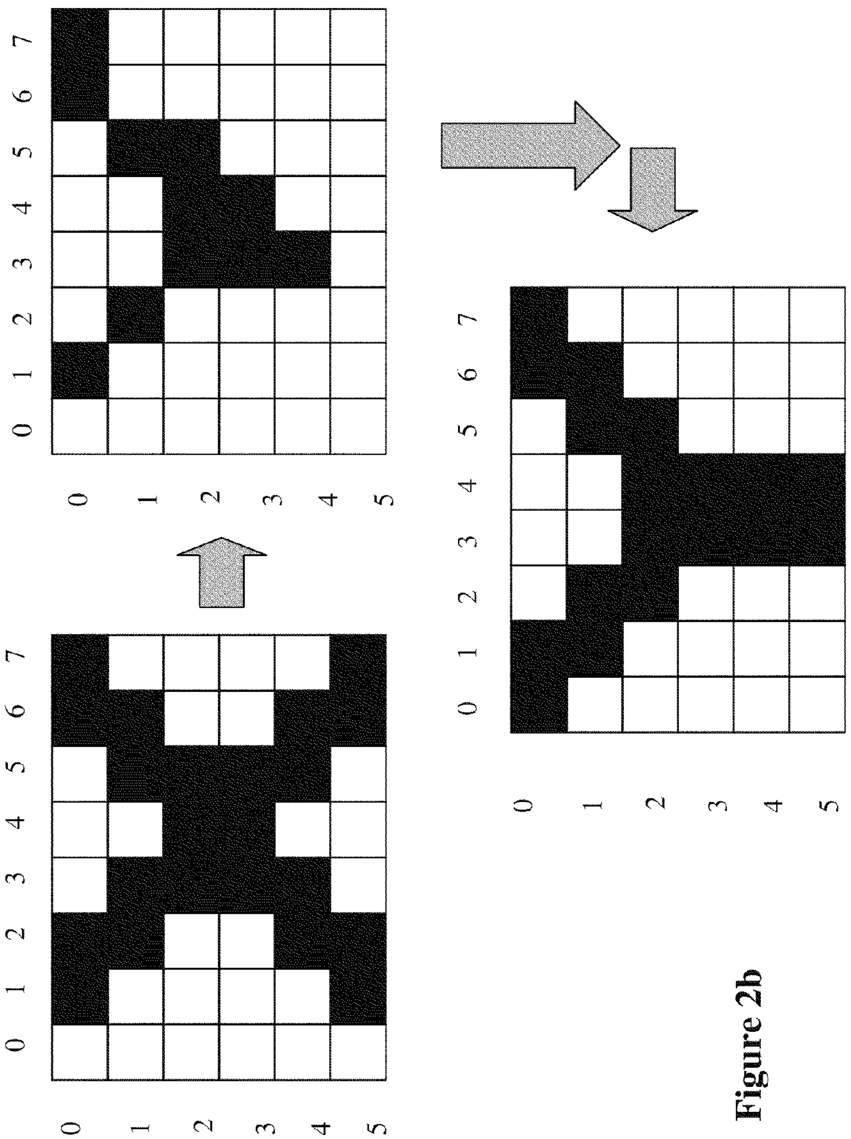

The present approaches may be used in many forms of displays including a segmented display and a non-segmented pixel-based display. As shown in FIG. 2*b*, a more complex pixelated image transition may also be achieved. In a first transition step (from the first image "X" to the intermediate image), black pixels which will become white (e.g., 2/0 [x/y], 3/1, 6/1, 5/3, 2/4, 5/4, 6/4, 1/5, 2/5, 6/5 and 7/5) have been switched to white, and in the second transition step (from the intermediate image to the second image "Y"), white pixels which will become black are switched to black (e.g., 0/0, 1/1, 6/1, 2/2, 4/4, 3/5 and 4/5).

Figure 3:
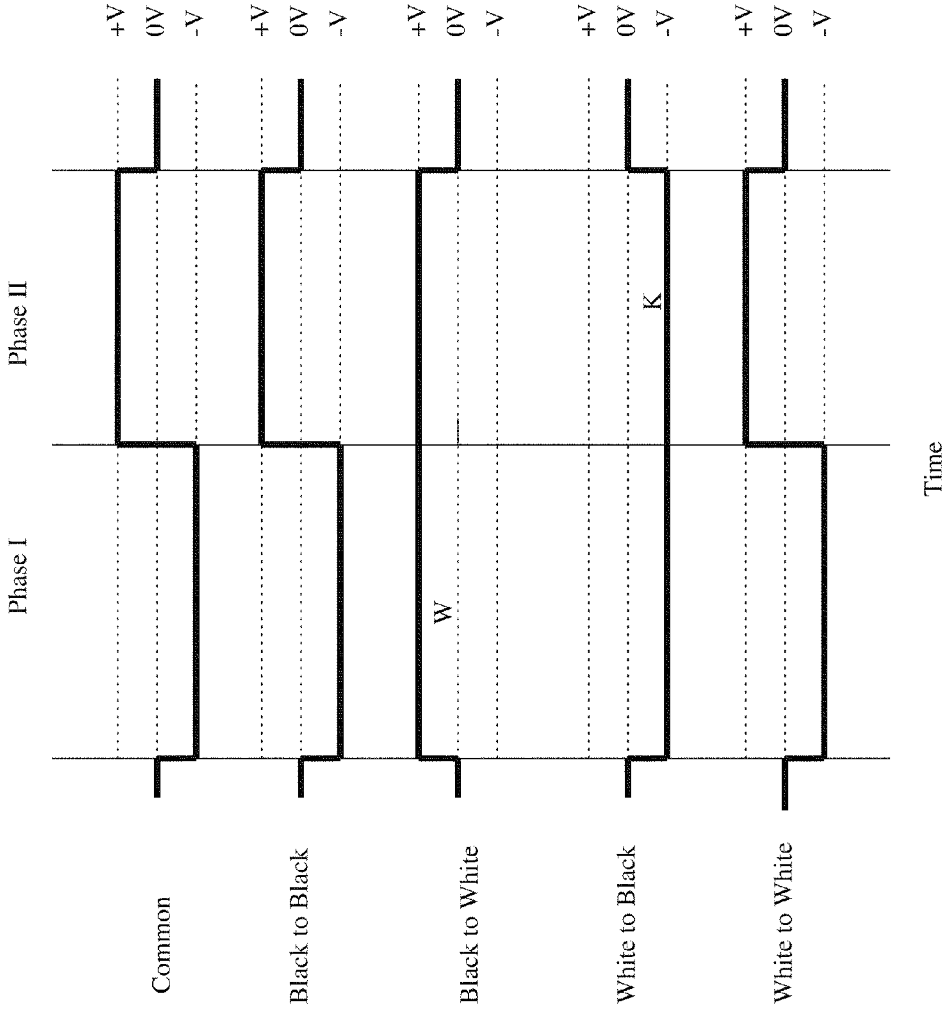
FIG. 3 illustrates an example of driving methods and waveforms.

FIG. 3 demonstrates such a driving method. In this example and those of FIG. 4 and FIG. 5, the pigment particles are positively charged and are of white or light color. The pigment particles are dispersed in a dark color solvent.

In an embodiment, the driving waveforms have two driving phases denoted I and II. There are five waveforms for the common electrode, associated with transitions of a black pixel to black, black pixel to white, white pixel to black and white pixel to white, respectively.

The waveforms for the black to black and white to white are identical to the waveform for the common electrode. This indicates that the pixels which do not undergo color change will not be driven.

For the black to white waveform, the color switches from black to white in Phase I and remains white in Phase II. For the white to black waveform, the color remains white in Phase I and switches to the black color state in Phase II. As demonstrated, the color change from black to white occurs (in Phase I) before the color change from white to black (in Phase II).

A second aspect is directed to the driving method of the first aspect, further comprising double pushing.

The term "double pushing" refers to applying a positive or negative driving voltage to a pixel to shorten the visual transition time.

Figure 4:
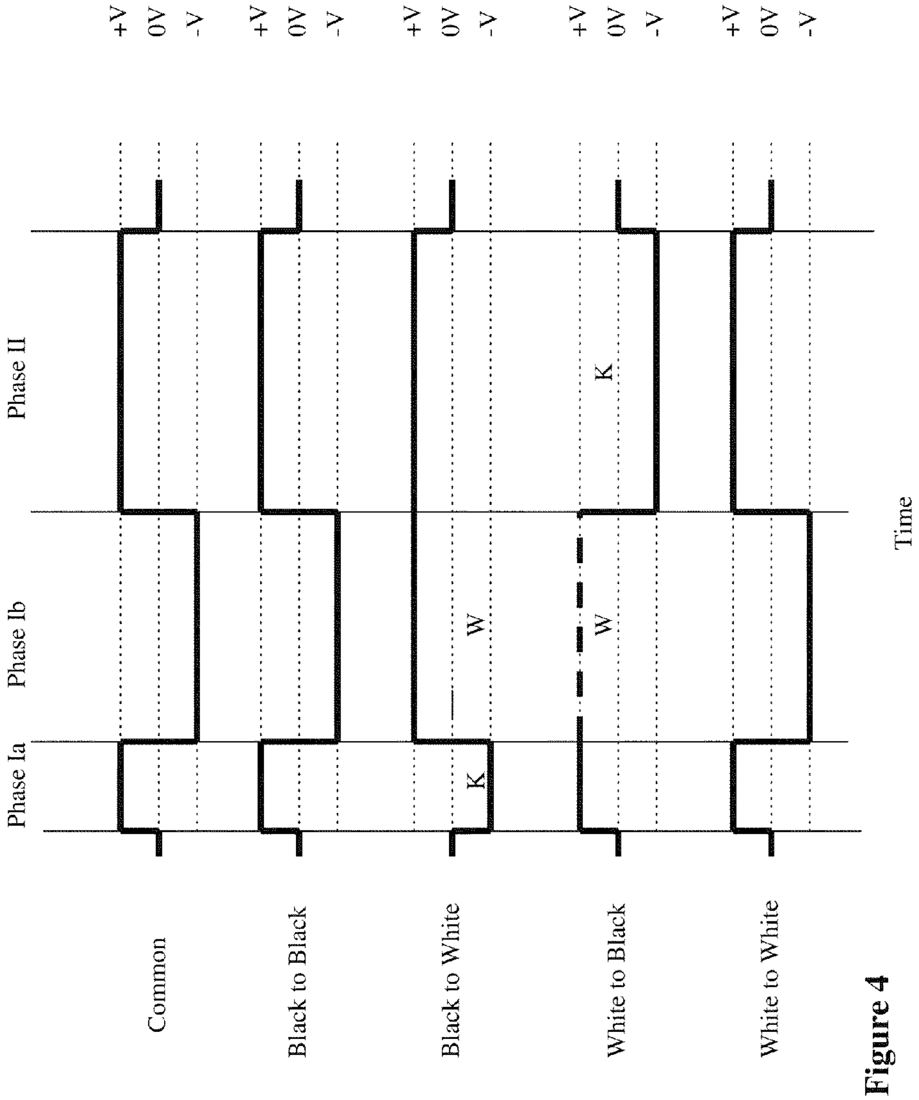
FIG. 4 illustrates alternative driving methods and waveforms and comprising double pushing.

Such a driving method is demonstrated in FIG. 4. The method of FIG. 4 comprises three driving phases (Ia, Ib and II). The time duration of Phases Ia and Ib together is close to the time direction of Phase I in FIG. 3. In Phase Ia, a negative driving voltage (for example, −2V) is applied to the black pixels which are to be driven to white. In this phase, the white particles are pushed further although no color change is observed. The black pixels switch to the white color in Phase Ib and remain in the white color state in Phase II. The presence of Phase Ia shortens the driving time from the black state to the white state (in Phase Ib compared with Phase I in FIG. 3), thus speeding up the color transition. Even though the driving time is shortened with the double pushing approach, the reflectance of the white state, however, is not compromised.

Similarly, for the white pixels to be driven to the black state, in Phase Ia, no driving voltage is applied, followed by a positive driving voltage (+2V) in Phase Ib causing the white pixels to remain white before switching to the black state in Phase II. In an embodiment, the duration of Phase Ib for the white pixels to be driven to black may be shortened to provide a shorter visual transition from white to black. But in any case, the color change of black to white takes place (in Phase Ib) before the color change of white to black taking place in Phase II.

The black pixels remaining black and the white pixels remaining white are not driven in FIG. 4.

A third aspect is directed to a driving method for driving a first image to a second image in a binary system wherein images of a first color are displayed with a background of a second color, which method comprises the driving the pixels of the first color state directly to a first intermediate color state before driving the pixels of the second color state directly to a second intermediate color state. In one embodiment, the first color state is black and the second color state is white. The "intermediate" color state is a color between the first and second color states. If the first color state is black and the second color state is white, then the intermediate color state may appear as gray. In one embodiment, the first and second intermediate colors are at different levels of gray or other intermediate coloration. In another embodiment, the first and second intermediate colors are at the same level of gray or other intermediate coloration.

Figure 5:
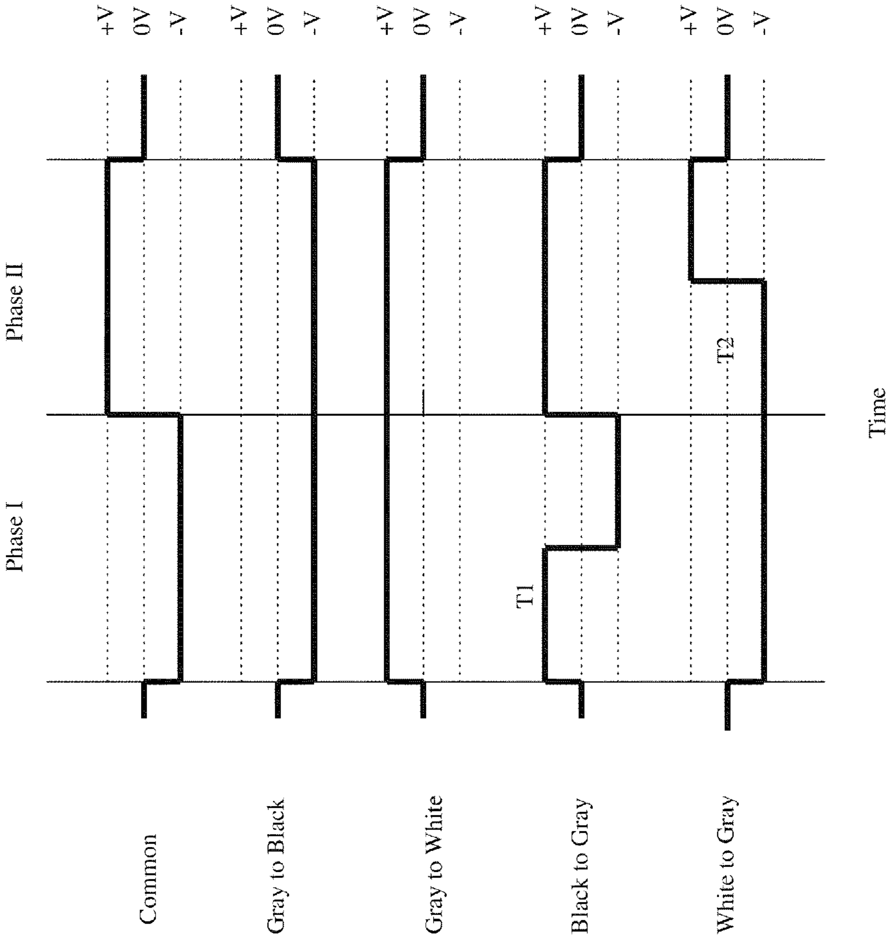
FIG. 5 illustrates a further example of driving methods and waveforms involving greyscale.

FIG. 5 is an example of such a driving method. For the black pixels to be driven directly to a gray level, the black pixels are driven to a gray state in the first part (marked T1) of Phase I and remain gray. For the white pixels to be driven to a gray level, the white pixels are driven to a grey level in the first part (T2) of Phase II. Therefore, the change of black to gray takes place before the change of white to gray. The broad approach of FIG. 5 may be used in displays with any combination of two contrasting colors and any intermediate color.

In an embodiment, the degree of grayness is determined by the length of the pulse applied. In FIG. 5, for the black pixels, the grey color becomes lighter when T1 increases and for the white pixels, the gray color becomes darker when T2 increases.

In all embodiments, the terms "before," "after," and "subsequent" in reference to driving waveform phases do not necessarily imply or require a time delay between phases. As shown in FIG. 3, FIG. 4, and FIG. 5, a subsequent phase may begin instantaneously after a prior phase.

In FIGS. 3-5, the voltage V may be 15 volts, but other embodiments may use other voltage levels.

In an embodiment, common electrode and the pixel electrodes are separately connected to two individual driving circuits and the two driving circuits in turn are connected to a display controller. In practice, the display controller issues signals to the driving circuits to apply appropriate driving voltages to the common and pixel electrodes respectively. More specifically, the display controller, based on the images to be displayed, selects appropriate waveforms and then issues driving signals, frame by frame, to the circuits to execute the waveforms by applying appropriate voltages to the common and pixel electrodes at appropriate times as defined by or to result in the waveforms disclosed herein. The term "frame" represents timing resolution of a waveform. The display controller may comprise a field programmable gate array (FPGA) or an application specific integrated circuit (ASIC) comprising logic that is configured to output signals causing the driving circuits to apply voltages corresponding to the waveforms that are shown and described herein. The waveforms may be stored in memory or represented in programmed arrays of gates or other logic. Such controllers are examples of electronic digital display controllers comprising circuit logic which when executed causes driving a display device from a first image to a second image wherein images of a first color are displayed with a background of a second color, by driving pixels of the first color directly to the second color before driving pixels of the second color directly to the first color.

The pixel electrodes may be TFTs (thin film transistors) which are deposited on substrates such as flexible substrates.

Although the foregoing disclosure has been described in some detail for purposes of clarity of understanding, it will be apparent to a person having ordinary skill in that art that certain changes and modifications may be practiced within the scope of the appended claims. It should be noted that there are many alternative ways of implementing both the process and apparatus of the improved driving scheme for an electrophoretic display, and for many other types of displays including, but not limited to, liquid crystal, rotating ball, dielectrophoretic and electrowetting types of displays. Accordingly, the present embodiments are to be considered as exemplary and not restrictive, and the inventive features are not to be limited to the details given herein, but may be modified within the scope and equivalents of the appended claims.

What is claimed is:

1. A method for driving an electrophoretic display from a first image to a second image in a binary system wherein images of a first color are displayed with a background of a second color and there are three groups of pixels between the first image and the second image:

(a) a first group of pixels which are pixels of the first color in the first image and of the second color in the second image, (b) a second group of pixels which are pixels of the second color in the first image and of the first color in the second image, and (c) a third group of pixels which are pixels of the first color in both the first image and the second image, which method comprises steps of driving all group of pixels to form the first image;

driving the first group of pixels to the second color to form a transitional image before driving the second group of pixels to the first color to form the second image, wherein the second group of pixels remains in the second color, and the third group of pixels remains in the first color;

driving the second group of pixels to the first color to form the second image, wherein the first group of pixels remains the second color and the third group of pixels remains the first color, wherein the first image, the transitional image and the second image have the same first color and the background colors.

2. The method of claim 1 wherein the first color is black and the second color is white, or vice versa.

3. The method of claim 1, further comprising double pushing which pushes charged pigment particles in display cells without causing color change.

4. An electronic digital display controller comprising circuit logic for executing the method of claim 1.

5. The electronic digital display controller of claim 4 wherein the first color is black and the second color is white, or vice versa.

6. The electronic digital display controller of claim 4, wherein the circuit logic which when executed causes double pushing which pushes charged pigment particles in display cells without causing color change.

7. The electronic digital display controller of claim 4 wherein the circuit logic is further configured to have pixels, of a color in the first image, which remain in the same color in the second image, not driven.

* * * * *